United States Patent [19]

Tsuya et al.

[11] 4,244,722
[45] Jan. 13, 1981

[54] METHOD FOR MANUFACTURING THIN AND FLEXIBLE RIBBON OF DIELECTRIC MATERIAL HAVING HIGH DIELECTRIC CONSTANT

[75] Inventors: Noboru Tsuya, 1-38, Kashiwagi 2-chome; Kenichi Arai, both of Sendai, Japan

[73] Assignee: Noboru Tsuya, Sendai, Japan

[21] Appl. No.: 967,434

[22] Filed: Dec. 7, 1978

[30] Foreign Application Priority Data

Dec. 9, 1977 [JP] Japan .................. 52-148604
Jun. 14, 1978 [JP] Japan .................. 53-72657

[51] Int. Cl.³ .................. C03B 19/02; C03B 32/00
[52] U.S. Cl. .................. 65/32; 65/100; 65/129; 65/374 M; 264/211; 264/212; 264/345
[58] Field of Search ........... 65/DIG. 5, 100, 184, 65/185, 32, 33, 99 R, 85, 129, 157, 374 M; 264/85, 345, 211, 212

[56] References Cited

U.S. PATENT DOCUMENTS

| | | | |
|---|---|---|---|
| 1,756,196 | 4/1930 | Hopkins et al. | 164/87 |
| 1,867,818 | 7/1932 | Freeland | 148/111 |
| 2,364,642 | 12/1944 | Miller et al. | 264/104 |
| 2,956,023 | 10/1960 | Fredrick et al. | 252/62.3 |
| 3,186,813 | 6/1965 | Pfaender | 65/DIG. 5 |
| 3,241,009 | 3/1966 | Dewald et al. | 357/2 |
| 3,256,081 | 6/1966 | Peyches et al. | 65/184 |
| 3,367,762 | 2/1968 | Teague, Jr. | 65/100 X |
| 3,381,739 | 5/1968 | Hart | 65/100 X |
| 3,445,554 | 5/1969 | Jerome | 264/56 |
| 3,545,967 | 12/1970 | Mandal | 75/134 |
| 3,663,767 | 5/1972 | Shimotori et al. | 360/127 |
| 3,737,509 | 6/1973 | Kobayashi et al. | 264/212 |
| 3,748,728 | 7/1973 | Watson | 29/599 |
| 3,812,226 | 5/1974 | DeBussy | 264/212 |
| 3,837,827 | 9/1974 | Carruthers et al. | 65/32 X |
| 3,896,203 | 7/1975 | Maringer et al. | 264/165 |
| 3,902,930 | 9/1975 | Sata et al. | 148/112 |
| 4,000,014 | 12/1976 | Winter | 148/11.5 R |
| 4,049,522 | 9/1977 | Ainslie | 360/126 |
| 4,065,330 | 12/1977 | Masumoto et al. | 148/31.55 |
| 4,079,430 | 3/1978 | Fujishima et al. | 360/126 |
| 4,135,218 | 1/1979 | Nakamura et al. | 360/127 |
| 4,146,391 | 3/1979 | Inoue et al. | 148/31.55 |

FOREIGN PATENT DOCUMENTS

51-138517 11/1976 Japan.

*Primary Examiner*—Richard V. Fisher
*Attorney, Agent, or Firm*—Fleit & Jacobson

[57] ABSTRACT

A method for manufacturing a thin and flexible ribbon of dielectric material comprises heating a raw material mainly consisting of dielectric material which can form a crystalline structure in a solid state and of a glass former which is included by 0 to 50 atomic percentages at a temperature above a melting point of the raw material to form a one phase melt;

ejecting the melt thus formed through a nozzle against a cooling surface of a rotating disc, drum or belt, the ejection being carried out under a pressure of 0.01 to 1.5 atm. to form a continuous jet flow of the melt; and cooling instantaneously and rapidly the jet flow of the melt while it is in contact with the cooling surface at a cooling rate of 1,000 to 1,000,000° C./sec so as to form a thin and flexible ribbon of the dielectric material which contains the amorphous state more than 50% in an area ratio. The dielectric constant and breakdown voltage of the ribbon thus formed are very high. Further the mechanical property of the ribbon is also superior to that of known plate or chip of dielectric material. The dielectric constant and the breakdown voltage can be improved by heating the ribbon as grown at a temperature within 300° to 1,100° C.

18 Claims, 5 Drawing Figures

FIG_3

METHOD FOR MANUFACTURING THIN AND FLEXIBLE RIBBON OF DIELECTRIC MATERIAL HAVING HIGH DIELECTRIC CONSTANT

BACKGROUND OF THE INVENTION

This invention relates to a method for manufacturing a thin and flexible ribbon of dielectric material having desired electrical, mechanical and physical properties by melting dielectric material selected from the group consisting of $LiNbO_3$, $LiTaO_3$, $NaTaO_3$, $AgNbO_3$, $WO_3$, $NaNO_2$, $BaTiO_3$, $PbTiO_3$, $Pb(Zr,Ti)O_3$, $SrTiO_2$, $Pb(Zn_{\frac{1}{3}}NB_{\frac{2}{3}})O_3$, $Ba_2Nb_2O_7$, $Ca_2Nb_2O_7$, $Bi_4Ti_3O_{12}$, $K_xWO_3 (0.43 \leq x \leq 0.51)$, $PbNb_2O_6$ and their composites to form a one phase melt thereof; ejecting the melt against a moving surface of a cooling substrate; and cooling instantaneously and very rapidly the melt on the cooling surface.

Hitherto, various kinds of dielectric glasses have been known as dielectric material which can form an amorphous structure by cooling a melt thereof. For instance, dielectric glass sheets or plates can be obtained by taking up the melt of dielectric glass material between a pair of rolls. Further, a dielectric glass fiber can also be obtained by blowing the melt out of a nozzle. However, dielectric constants of dielectric glasses, such as $Bi_2O$, $CdO$ and $SiO_2$ are relatively small and usually lie within the range of 16-32. Any dielectric glass having a higher dielectric constant has not been found. Further, the dielectric glasses have the poor mechanical property, i.e., their impact resistance and heat resistance are poor and it is very difficult to work the dielectric glasses.

The dielectric materials described in the preamble are known to have relatively higher dielectric constants than the dielectric glasses. These dielectric materials form a crystalline structure in a solid state and thus are called as crystalline dielectric material in this specification. It is known to form a thin dielectric film or layer on a substrate by vapor-depositing, electric-depositing or sputtering these crystalline dielectric materials. The film thus formed includes partially the amorphous structure. However, by such known methods, it is impossible to produce a thin and flexible ribbon of dielectric material without using the substrate. In other words, the known methods could not form the thin ribbon of dielectric material which does not adhere to the substrate.

It is possible to obtain a thin plate or chip of dielectric material by slicing a rod of dielectric material. However, since the rod has wholly the crystalline structure, the obtained thin plate is also wholly of crystalline. Such a thin plate is quite fragile and thus could not be practically used in manufacturing devices and elements. Further, the dielectric constant of the thin plate is rather low. Moreover, the slicing is a quite cumbersome operation and thus it is impossible to form the thin plates at a high speed on a mass production.

SUMMARY OF THE INVENTION

The present invention has for its object to provide a novel and useful method for manufacturing a thin and flexible ribbon of dielectric material having excellent mechanical, physical and electrical properties in a simple and rapid manner.

A method for manufacturing a thin and flexible ribbon of dielectric material according to the invention comprises heating raw material mainly consisting of dielectric material which can form a crystalline structure in a solid state and including a glass former by an amount of 0 to 50 atomic percentages, at a temperature within the range from a melting point to 300° C. above the melting point to form a one phase melt of the dielectric material;

ejecting the melt through a nozzle under a pressure against a moving surface of a cooling substrate in the form of a jet flow of the melt; and cooling instantaneously and very rapidly the jet flow of the melt on the cooling surface at a cooling rate from 1,000° C. to 1,000,000° C./sec to form a thin and flexible ribbon of the dielectric material containing an amorphous structure by more than 50% in an area ratio.

In the method according to the invention, various kinds of dielectric materials which have high dielectric constant and can form the crystalline structure in a solid state can be used. For instance, mention may be made of a perovskite type dielectric material, such as $BaTiO_3$, $PbTiO_3$, $Pb(Ti,Zr)O_3$, $LiTaO_3$, $NaNbO_3$, $NaTaO_3$, $AgNbO_3$, etc.; a complex perovskite compound type dielectric material such as $Pb(Zn_{\frac{1}{3}}Nb_{\frac{2}{3}})O_3$, $Pb(Fe_{\frac{1}{2}}Nb_{\frac{1}{2}})O_3$, etc.; a pyrochlore type dielectric material such as $Ba_2Nb_2O_7$, $Ca_2Nb_2O_7$, $Ba_2Ta_2O_7$, etc.; a bismuth layer type dielectric material such as $BaBi_2Ta_2O_9$, etc.; and a tungsten bronze type dielectric material such as $K_xWO_3 (0.43 \leq x \leq 0.51)$ and $PbNb_2O_6$, etc.

According to the method of the invention, the thin ribbon of dielectric material having a high dielectric constant can be obtained from these crystalline dielectric materials having a high dielectric constant, by cooling instantaneously and very rapidly the melt of these dielectric materials. One of important features of the thin and flexible ribbon of dielectric material formed by the method according to the invention is that a length of the ribbon is quite long. For this purpose it is preferable to carry out the ejection and cooling in a reduced atmosphere including a vacuum. When the ribbon departing from the cooling surface at a high speed is subjected to the air resistance, the ribbon might be corrugated or broken and thus the long ribbon could not be obtained. Further in order to avoid an over oxidation of the ribbon the cooling is sometimes preferable to be conducted in an inert gas such as argon and neon. Even in such a case it is preferable to reduce the atmospheric pressure of the inert gas.

According to the invention various elements can be dissolved into the melt for improving and adjusting the various properties of the dielectric thin ribbon.

At first, a thin and flexible ribbon of composite dielectric material can be obtained by cooling instantaneously and very rapidly a melt formed by melting a plurality of dielectric materials which have similar crystalline structures in a solid state and form a solid solution over a wide mixing ratio. For instance, $(Ba,Pb)TiO_3$ series compounds can form such a complex dielectric material.

Some elements dissoluble to the melt can be added to the melt of dielectric material in the form of an element itself or its compound such as oxide. These elements and compounds can be added to the melt in the form of a single substance, a mixture or a composite. Some elements may be added as a flux such as $PbO$ and $NaCO_3$.

Some transition metal elements such as La, Fe, etc. can be also dissolved in the metal which elements are partly substitutable in the crystalline state with one or more metallic elements contained in the raw dielectric materials.

In the method according to the invention, it has been found that these elements can be added to the thin ribbon of dielectric material by an amount which is usually greater than a solid solubility limit of the crystalline state in normal condition.

Further possible additive elements are all elements which can dissolve into the melt of dielectric material in the molten state so as to form a one phase melt.

The aforementioned additive elements are effective to vary or adjust the various properties, particularly the electrical property of the thin ribbon of dielectric material.

After conducting many tests and experiments the inventors have found that it is more preferable to add a glass former into the melt of dielectric material by an amount of 0–50 atomic percentages so as to obtain a dielectric thin ribbon of good quality, particularly having excellent mechanical properties such as flexibility, strength, compact resistance and configuration. Such a glass former can be defined to have a comparatively high viscosity in the molten state without decomposition and to form very easily a one phase with almost all dielectric materials.

The dielectric thin ribbon containing the glass former is characterized in uniformly smooth and flat configuration and surface condition, a non porous inside structure, an optical transparency, a large mechanical strength and high breakdown voltage.

Glass formers may be classified into an oxide group, a fluoride group, a phosphate group and a chalcogenide group.

As the glass former belonging to the oxide group, mention may be made of $B_2O_3$, PbO, $Bi_2O_3$, etc, which give good effect to almost all dielectric materials. $Li_2O$, $K_2O$, MnO, $Lu_2O_3$, $Cs_2O$, SnO, $SnO_2$, $GeO_2$, $Sb_2O_3$, etc. can also give good result to fairly various kinds of dielectric materials. For several dielectric materials $P_2O_5$, $V_2O_5$, $In_2O_3$, etc. can be advantageously used as the glass former for promoting the formation of the amorphous state. Each kind of iron oxides and rare earth oxides; BeO, MgO, CaO, ZnO, CdO, SrO, BaO, etc; $ThO_2$, $ZrO_2$, $WO_3$, etc. can be also added as the glass former for forming effectively the amorphous state in dependence upon the kind of dielectric materials to be used, but in most cases, these glass former materials are liable to be educed as crystalline substance for almost all dielectric materials. In addition, if it is advantageous to highly raise a temperature of the melt of dielectric material, $SiO_2$, $Al_2O_3$, $As_2O_3$, etc. may be used as the glass former for many dielectric materials. It is a matter of course that the above oxides may be also used as a complex or composite form and in many cases, the composite glass former is more effective than the glass former of single substance.

As the glass former of the fluoride group, $PbF_2$, LiF, NaF, $BeF_2$, $MgF_2$, $CaF_2$, $ZnF_2$, $CdF_2$, $SrF_2$, $BaF_2$, $AlF_3$, $BiF_3$, $CeF_3$, $SnF_4$, etc. and their composites can be used for promoting the formation of an amorphous state. They also exhibit a flux effect. Particularly, fluorides having a low melting point such as $PbF_2$ are very effective as the glass former. Further, the fluorides can be advantageously used as composite substances with glass former materials of the above mentioned oxide group. When such a composite glass former and dielectric material are heated to form a one phase melt, the glass former has a great effect to decrease a melting point of the melt.

The nitrate group and the phosphate group include many glass formers having a great effect, but the glass formers belonging to these groups cannot always be used for various kinds of dielectric materials and thus particular glass formers should be selected depending upon the dielectric material to be used. When the glass former material is decomposed prior to the formation of the melt of the dielectric material, it is converted into the oxide glass former. $K_2O$, $Na_2O$, $CsNO_3$, $AgNO_3$, $Sr(NO_3)_2$, $Ba(NO_3)_2$, $Na_2S_2O_7$, $K_2S_2O_7$, $K_2SO_4$, etc., and these oxides including Ta, Nb, Zr, Hf, etc. can be advantageously used as the glass former of the nitrate and phosphate groups.

Upon fusing crystalline highly dielectric material in order to obtain the thin ribbon of dielectric material, the following points should be taken into consideration. That is, the melt of dielectric material should have such a viscosity that upon ejecting the fused crystalline highly dielectric material through the nozzle the melt is ejected as a continuous jet flow. When the melt is heated to an excessively higher temperature than the melting point, the viscosity of the melt becomes too low, so that the melt spontaneously exudes from the nozzle and becomes liquid-drop-like. If the dielectric material is fused at a still higher temperature than that, the melt spontaneously flows down without applying a pressure and no thin ribbon can be obtained, and as a result, any dielectric thin ribbon of good quality cannot be obtained. Therefore, it is required that crystalline highly dielectric material should be fused at its melting point or just above the melting point. Such demand shows that the range of conditions for manufacturing a dielectric thin ribbon of good quality is considerably limited.

The addition of the glass former according to the invention therefore becomes important. That is, the effects of the glass former consisting of any one of the above-described flux materials can be summarized as follows. First, the glass former can lower a melting point of raw dielectric material for forming the dielectric thin ribbon. Secondly, the glass former serves to maintain the melt of dielectric material into a one phase. The melt without the glass former has a tendency to separate into more than two phases. And thirdly, the glass former is quite effective to increase the viscosity of the melt which is heated above the melting point and would be less viscous without the glass former. By increasing the viscosity of the melt, the melt can be ejected from the nozzle as the jet flow which is essential for forming the dielectric thin ribbon. That is, by adding the glass former of suitable composition to the melt of dielectric material by a suitable ratio, it is possible to widen a proper temperature range of the melt immediately before and during the ejection thereof, and this function is very important for obtaining the thin ribbon of dielectric material of good quality.

Further, the importance of addition of the glass former can be understood from the following.

In case of super-rapidly cooling the fused dielectric material on the moving surface of the cooling substrate such as a rotating disc, flatness of the rear surface of the obtained thin ribbon, i.e., the surface made into contact with the moving surface, is mainly determined by flatness of the moving surface of the cooling substrate. On the other hand, flatness of the front surface of the dielectric thin ribbon, i.e., the surface not made into contact with the cooling surface of the moving substrate, closely relates to a behavior of surface movement where surface tension and viscosity of the fused dielectric material perform their roles. Therefore, if conditions for limiting the formation of the dielectric thin ribbon, which will be explained later on, for instance, an ejection pressure and a moving speed of the cooling surface are not properly selected, the front surface and the width of the thin ribbon might be irregular. In some extreme cases the thin ribbon having good configuration could not be formed, but a greatly notched ribbon like as a rattan blind might be produced. By properly adjusting the surface tension and viscosity of the melt by adding a suitable glass former by a suitable amount, a possible range of the ejection pressure and the moving speed of the cooling surface can be materially widened. Accordingly, the addition of the glass former makes it possible to form the long thin ribbon having a good configuration from the melt of dielectric material under such a condition that the dielectric material alone would form only flakes or grains of dielectric material.

Further, the addition of the glass former exhibits also the following effect.

That is, the addition of the glass former has such effect that a width of the thus obtained thin ribbon is made far wider than a diameter of a nozzle hole, a thickness of the thus formed thin ribbon is thin and uniform. Further, the glass former can remarkably suppress the separation of the crystalline structure in the thin ribbon and thus the ribbon becomes highly transparent optically. In other words, the glass former can enhance the formation of the amorphous state in the thin ribbon to a great extent.

As explained above in order to obtain the thin ribbon of dielectric material having an excellent configuration it is essential to select properly several factors such as the viscosity and surface tension of the melt, the ejection pressure, the surface condition and moving speed of the cooling surface, etc. The viscosity of the melt is mainly determined by the temperature of the melt. In general, the higher the temperature of the melt, the larger the viscosity of the melt becomes. According to the invention, the temperature of the melt is preferable within the range from the melting point to 300° C. above the melting point, particularly the range from the melting point to 150° C. above the melting point. By heating the melt to a temperature within such a range its viscosity becomes suitable for forming the thin ribbon having a regular configuration. The viscosity of the melt also relates to a wettability of the jet flow of the melt on the cooling surface. The wettability of the melt is also related to a kind of material forming the cooling surface. For this purpose, the cooling substrate has to be made of proper material which provides a suitable wettability. The inventors have found that the viscosity and the wettability should be selected to such values that the jet flow of the melt situated on the cooling surface makes at its edges a contact angle of 10° to 170°, preferably 45° to 135° with respect to the cooling surface.

The proper ejection pressure is also important in order to form the thin ribbon of the good configuration. The ejection pressure is preferably selected within the range from 0.01 to 1.5 atm., particularly from 0.01 to 1.0 atm. If the pressure is made lower than 0.01 atm., the melt could not be ejected smoothly out of the nozzle and the continuous jet flow of the melt could never be obtained, so that it is impossible to form the thin ribbon of large length. On the other hand, if the ejection pressure is higher than 1.5 atm., the melt might be blown through the nozzle so as to form a mist or cloud of particles or powders of dielectric material and thus any ribbon of dielectric material could not be produced.

In the method according to the invention, dielectric material may be fused to form its melt by means of a resistance heating, a high frequency heating or any other suitable heating method.

During the ejection step in the method according to the invention, the nozzle and the cooling surface should be close to each other and a distance therebetween is preferably selected to several millimeters. However, during the formation of the melt in the heat resistance tube the tube is preferably made apart from the cooling surface, because otherwise the cooling surface might be heated to an unpermissible extent. After the melt has been prepared the tube is moved toward the cooling surface and when the nozzle reaches immediately above the cooling surface, the ejection of the melt is initiated. The level of the nozzle may be detected by means of a micro-switch.

In order to obtain a dielectric thin ribbon of good quality, the nozzle should be made of platinum or platinum-rhodium. Further, as the configuration of the nozzle hole, it may be circular, rectangular or elliptical, but any configuration can be selected in accordance with the size of the dielectric thin ribbon to be obtained. If the inner surface of the nozzle is lined with boron nitride, the fused dielectric material can easily and smoothly be ejected and such a nozzle can be manufactured easily.

As described above, the ejection pressure is preferably selected within the range of 0.01 to 1.5 atm. In practice, the ejection pressure has to be determined by taking into account of the various factors mentioned before. Even if the ejection pressure is adjusted to such a value that the thin ribbon having a good configuration can be formed, when the ejection pressure is higher or lower than the most favorable value, an amount of crystalline structure included in the final thin ribbon increases. The inventors have found that for almost all dielectric materials the ejection pressure can be preferably selected within the range of 0.01–1.0 atm.

In order to obtain the dielectric thin ribbon of good quality by ejecting the melt of dielectric material against the moving surface of the cooling substrate and by rapidly cooling the melt on the surface it is preferable that the cooling substrate has a good thermal conductivity. For instance, the cooling substrate can be made of copper, copper-beryllium, brass, stainless steel or carbon steel.

The inventors have further found that a moving speed of the cooling surface is also one of important factors for forming the thin ribbon having good configuration. When the speed is too slow, the dielectric thin ribbon becomes thick in thickness, flaky and simultaneously crystalline. When use is made of a disc having a diameter of 50–350 mm as the cooling substrate, the rotating speed is preferably more than 1,400 rpm, and more preferably 1,400–30,000 rpm.

The diameter of the cooling disc should meet with the above mentioned factors such as the melting temperature of dielectric material, the rotating speed and the ejection pressure. For instance, even if linear speeds of the rotating surfaces of two discs are same, the larger the diameter, the smaller a centrifugal force at the rotating surface is produced. Therefore, when the disc having the larger diameter is used, the dielectric thin ribbon of good quality cannot be obtained from the melt having a large adhesivity to the rotating surface, because in this case, the cooling time becomes too long. On the contrary, when the melt has a small adhesivity, the cooling period is too short and it is impossible to obtain the dielectric thin ribbon of good quality containing at least partially the amorphous structure. According to the invention, the diameter is preferably set to about 50–350 mm$\phi$. It has been found that the linear moving speed of the cooling substrate is preferably higher than 5 m/sec.

The cooling substrate may be of a disc, drum or cup shape. In case of a disc or drum type cooling substrate, the flat and smooth edge peripheral surface may be used as the cooling surface. In case of a cup type cooling substrate, the flat and smooth inner surface may be used as the cooling surface. Further use may be made of an endless belt.

As described above, according to the invention, it is possible to form the thin and flexible ribbon of dielectric material and the ribbon includes the amorphous structure of dielectric material more than fifty percentages in an area ratio. The electrical properties such as the dielectric constant and breakdown voltage of such a thin ribbon as grown are superior to those of the thin films or flakes formed by the known methods and can be used for various devices and elements. However, for some applications the electrical properties of the thin ribbon as grown are not sufficient.

According to further aspect of the invention it has been found that the electrical properties of the ribbon can be improved by subjecting it to a heating treatment. To this end, the thin and flexible ribbon of dielectric material having the amorphous structure is heated to a temperature within the range of 300° to 1,100° C. so as to form crystalline grains having diameters from 0.01 $\mu$m to 5.0 $\mu$m. Almost all dielectric materials have a crystallization point, i.e. a temperature at which the amorphous structure is transformed into the crystalline structure within said temperature range of 300° to 1,100° C. For instance, LiNbO$_3$ has the crystallization temperature of 450° C., and BaTiO$_3$ and PbTiO$_3$ have the crystallization temperatures within 800° to 900° C. If the diameters of the crystalline grains are smaller than 0.01 $\mu$m, a volume ratio of the crystalline structure in the ribbon becomes too small and the property of the amorphous structure becomes predominant and thus the improvement in the electrical properties of the ribbon could hardly be observed. Whereas, if the grain diameter exceeds 5.0 $\mu$m, the variation in construction of the ribbon from the amorphous state to the crystalline state becomes great and thus cracks might be formed in the ribbon.

The heating treatment may be carried out in an air, a reduced atmosphere, a vacuum or an inert gas atmosphere.

DESCRIPTION OF THE PREFERRED EMBODIMENTS

Figure 1:
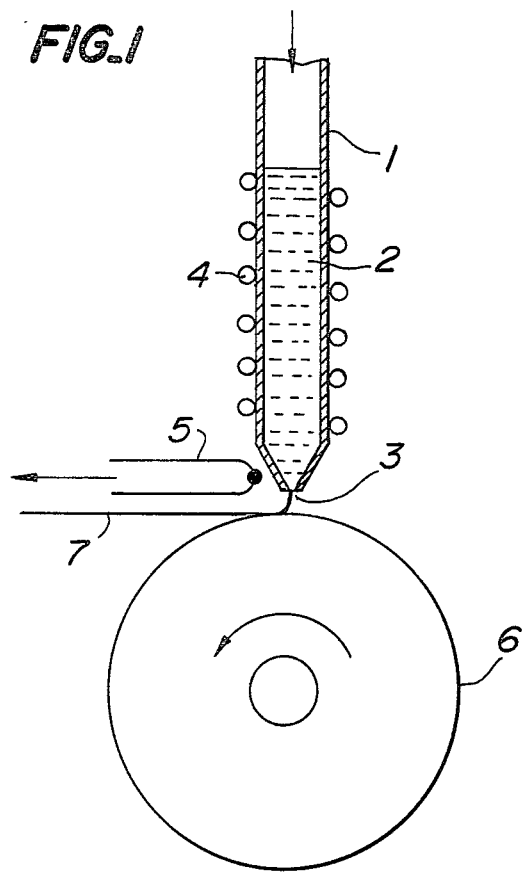
FIG. 1 is a schematic view showing an apparatus for carrying out the method according to the invention.

FIG. 1 shows schematically an apparatus for manufacturing a thin and flexible ribbon of dielectric material according to the method of the present invention. The first two examples which will be explained hereinafter use the manufacturing apparatus shown in FIG. 1.

EXAMPLE 1

In FIG. 1, a reference numeral 1 denotes a heat resisting tube for containing crystalline highly dielectric material, in this example LiNbO$_3$. This tube 1 is made of such material that does not react with fused crystalline highly dielectric material. The tube is made of platinum, platinum-rhodium, etc. The tube 1 is provided with a nozzle 3 of 0.1–0.5 mm$\phi$ in diameter at its lower end. Around the tube 1 is provided a resistance heater 4 which heats the crystalline highly dielectric material in the tube 1 at a temperature of 1,250°–1,300° C. to form a uniform melt 2. The temperature of the melt 2 can be detected by a thermocouple 5 arranged near the nozzle 3. Below the nozzle 3 is movably arranged a cooling substrate 6. In this embodiment the substrate 6 is formed by a rotating disc made of copper having a high thermal conductivity. The disc 6 has a diameter of 300 mm$\phi$ and is made rotatable at 3,800 rpm. A peripheral edge surface of the disc 6 is made flat and smooth and serves as a cooling surface.

After the nozzle 3 was made close to the flat and smooth moving surface of the disc 6, the melt 2 of LiNbO$_3$ in the tube 1 was ejected through the nozzle 3 against the moving surface with changing an ejection pressure within the range of 0.1–1.0 atmospheric pressure. The melt 2 was ejected as a continuous jet flow and the jet flow was rapidly or instantaneously cooled on the moving surface of the cooling disc 6. The cooled jet flow was thrown at a high speed in a direction shown by an arrow so as to form a thin and flexible thin ribbon of dielectric material.

The thus grown thin ribbon was typically 5–30 $\mu$m in thickness and 0.1–0.8 mm in width. When observing with a metallurgical microscope, it was confirmed that the whole or a considerable part of the thin ribbon is the amorphous state.

Figure 2:
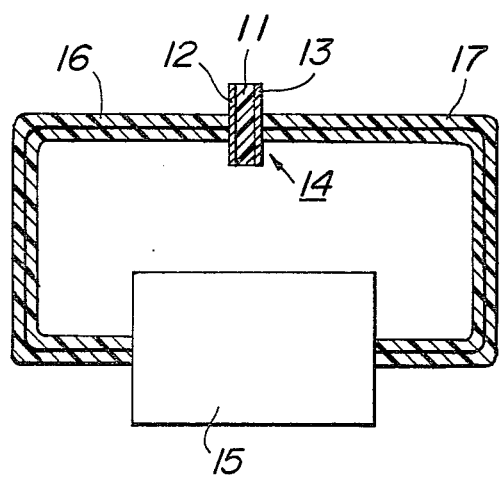
FIG. 2 is a schematic view illustrating a device for measuring a dielectric constant of the ribbon of dielectric material manufactured by the method according to the invention.

Next a dielectric constant of the thin and flexible ribbon of 7 $\mu$m in thickness, 0.5 mm in width and 5 mm in length was measured. That is, as shown in FIG. 2, after a pair of electrodes 12, 13 were applied on both surfaces of a ribbon 11 to form a capacitance 14 a dielectric constant thereof was measured with connecting the electrodes to a transformer bridge 15 by means of coaxial cables 16 and 17. The dielectric constant thereof was 75, which is far larger than that of a conventional single crystal of LiNbO$_3$.

Further the thin ribbon was hung in such a manner that it can vibrate freely and a motional impedance was measured by applying an electric oscillation thereto. It was confirmed that the electric oscillation is converted into a mechanical vibration, and as a result, it was found that the thin ribbon can be utilized as an electric-mechanical transformer, i.e. piezoelectric element.

EXAMPLE 2

In this example $PbTiO_3$ was used as crystalline highly dielectric material and fused at a temperature of 1,300°–1,350° C. A thin ribbon of dielectric material of $PbTiO_3$ was formed by means of the apparatus shown in FIG. 1 under such conditions that the disc 6 was rotated at a 3,000 rpm and the ejection pressure was 0.8 atmospheric pressure. The thus obtained thin ribbon was 10–20 μm in thickness and 0.3–0.6 mm in width. After the internal structure of this thin ribbon was studied by an X-ray apparatus and the metallurgical microscope, it was confirmed that almost all the thin ribbon is in the amorphous state.

Its electrical properties were also measured in the same manner as in Example 1, and as a result, very large dielectric constant was detected and it was found that the thin ribbon can be utilized as an electro-mechanical transformer.

Besides the above mentioned excellent properties the thin ribbons of dielectric material have the following properties.

A mechanical strength of the thin ribbon manufactured by the method according to the invention is substantially higher than thin crystalline ribbons or chips formed by the known methods. The maximum bending force at which the ribbon according to the invention is broken is 5–6 times higher than that of the known crystalline thin ribbon. That is, the flexibility of the thin ribbon according to the present invention shows an absolutely high value as compared with the known thin ribbon.

Next an optical transmittivity of the thin and flexible ribbon of dielectric material according to the invention was observed with the use of a microscope. A known polycrystalline thin ribbon is opaque or translucent. The ribbon according to the invention is highly transparent under the parallel nicol state, but becomes dark under the crossed nicol state and a boundary of the thin ribbon is only visible.

To the capacitances formed in each of the above Examples was applied a direct current bias voltage during the measurement of electrostatic capacitance. The dielectric breakdown voltage of the ribbon according to the invention was more than 10 times higher than that of the known thin ribbon of polycrystalline structure. This fact shows that the thin and flexible ribbon of dielectric material according to the invention has remarkably high resistance against the dielectric breakdown as compared with the known thin ribbon of polycrystalline material.

As already explained in the above Examples, the thin and flexible ribbon of dielectric material according to the invention has very large dielectric constant. The dielectric constant of the according to the invention is about 10 times higher than that of a thin chip cut from the single crystal rod.

The reason why the thin ribbon of dielectric material according to the invention has the higher dielectric constant can be assumed that the ribbon has no crystal structure or even if the crystal structure is existent, its area ratio is less than 50%, and therefore the polarization of atoms or ions which is caused by applying an electric field and which is essential for providing a high dielectric constant does not inherently depend upon the orientation.

As for electric field dependency of the dielectric constant in connection with the presence of polarization, the dielectric constant is slightly lowered as the applied bias voltage is raised. This is due to either a non-linearity of the dielectric constant of the ribbon or a ferroelectric characteristic in which a coercive force or field due to dielectric hysteresis is very small.

According to the invention the ribbon of dielectric material contains the amorphous structure preferably by more than 50% in an area ratio. If the amorphous structure contained in the ribbon is less than 50%, its mechanical strength becomes low and the thin and flexible ribbon could be hardly grown.

Further, if the whole apparatus is placed in vacuum, air resistance is eliminated and thus the long ribbon having better configuration can be obtained. Next such as apparatus will be explained in detail.

The cooling substrate may be of a disc, drum or cup shape. In case of a disc-type cooling substrate, the flat and smooth edge peripheral surface may be used as the cooling surface. In case of a cup type cooling substrate, the flat and smooth inner surface may be used as the cooling surface.

Figure 3:
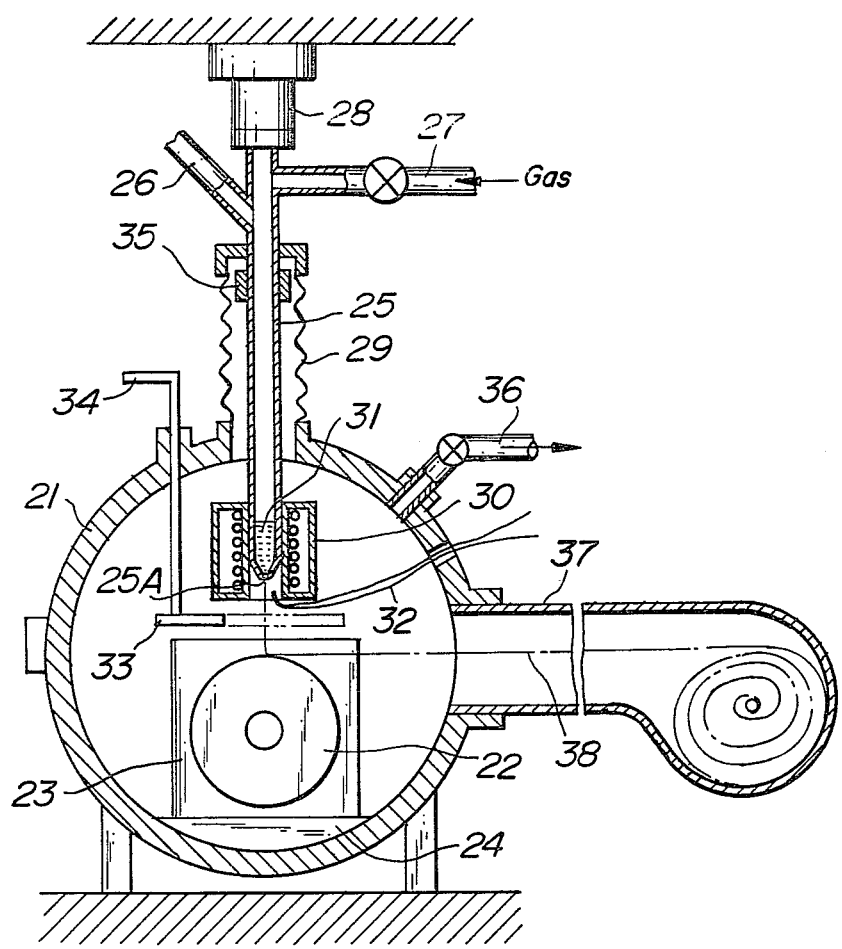
FIG. 3 is a cross-section for depicting another embodiment of the apparatus for manufacturing the ribbon of dielectric material.

FIG. 3 shows an apparatus for manufacturing a dielectric thin ribbon according to the invention. The present apparatus comprises a vacuum chamber 21, in which a disc 22 is rotatably arranged. The disc 22 is made of any material having good thermal conductivity such as copper, and coupled to an electric motor 23. A rotation speed of the motor 23 can be varied up to about 300,000 rpm. The motor 23 is fixed on a stand 24. Immediately above the rotary disc 22 is movably placed a heat resisting tube 25 into which crystalline highly dielectric raw material is charged from an inlet pipe 26. The tube 25 is further connected to a pipe 27 for injecting gas for ejecting the fused crystalline highly dielectric material from the nozzle 25A. The tube 25 is coupled to a cylinder 28 for moving the tube up and down and adjusting a distance between the nozzle 25A and the rotary disc 22. The vacuum chamber 21 and the tube 25 are connected by means of an air tight bellows 29 so as to close a space therebetween. Around the lower end of the tube 25 is arranged a heater 30 for heating the crystalline highly dielectric material charged in the tube at a temperature of 1,250°–1,300° C. so as to form a melt 31 thereof. The temperature of the melt 31 can be measured by a thermocouple 32 arranged around the nozzle 25A. In order to prevent the cooling disc 22 from being heated a shutter 33 is rotatably arranged between the rotary disc 22 and the nozzle 25A. The shutter 33 may be rotated by a handle 34 from the external. Around the tube 25 is arranged a permanent magnet 35 which can be moved along the tube 25 by means of a knob (not shown) from the outside. The vacuum chamber 21 is further provided with an exhaust pipe 36 which is connected to an exhaust system (not shown). A collecting port 37 is further coupled to the chamber 21 for taking out the thin ribbon 38.

If the crystalline highly dielectric raw material is non-magnetic material containing no ferromagnetic oxide, this material may be charged into the tube 25 before setting the tube in the vacuum chamber 21 or after heating the tube 25 by the heater 30.

In case that the crystalline highly dielectric raw material is a mixture with a ferromagnetic oxide, it may be moved downward in the tube 25 by descending the magnet 35 after charging the raw material through the inlet pipe 26.

In case that the fused crystalline high dielectric material 31 is ejected from the nozzle 25A and rapidly cooled on the rotating surface of the rotary disc 22 so as to obtain a dielectric thin ribbon, the vacuum chamber 21 may be a normal atmospheric pressure. In order to obtain a relatively long dielectric ribbon, a pressure of the vacuum chamber 21 may be preferably reduced and in such a case the melt 31 may be ejected under a relatively low pressure. Further, in order to prevent excessive oxidation, an inert atmosphere such as $N_2$, Ar and the like may be contained in the vacuum chamber 21. Also in such a case it is preferable to reduce the pressure in the chamber.

EXAMPLE 3

In this example a raw material consisting of $LiNbO_3$ as crystalline highly dielectric material having 10 atomic percentages of $K_2S_2O_7$ as a glass former added thereto was thrown into the tube 25 from the pipe 26 of the apparatus shown in FIG. 3. The raw material was heated at a temperature of 1,250°–1,300° C. to form a melt 31 thereof. Then, the rotary disc 22 made of copper and having a diameter of 300 mm$\phi$ was rotated at 3,800 rpm. After the shutter 33 was opened and the tube 25 was moved downward, the melt 31 of $LiNbO_3$ was ejected through the nozzle 25A against the rotating surface of the disc 22 with changing the ejection pressure from 0.1 to 1.0 atmospheric pressure. The jet flow of the melt was rapidly cooled on the rotating surface and a thin and flexible ribbon of dielectric material 38 was obtained.

Figure 4:
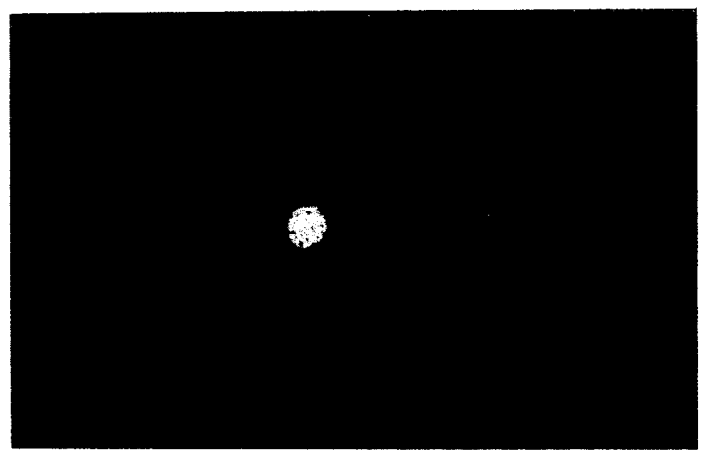
FIG. 4 is a photograph showing a diffraction image of the thin ribbon of dielectric material.

The thus obtained thin ribbon was a long one having a thickness of 10 to 25 $\mu$m and a uniform width, and had the very good, colorless and transparent surface state. When this thin ribbon was observed under a metallurgical microscope, it was confirmed that the whole or a considerable part of the thin ribbon is under the amorphous state. For further confirmation, a diffraction image of the thin ribbon was observed by a 1,000 kv very high voltage electron microscope. FIG. 4 is a photograph showing this diffraction image. As shown in FIG. 4, a blurred halo apparently appears and it was confirmed that the sample is wholly amorphous. This sample was further observed by a high temperature metallurgical microscope, and it was found that crystallization occurs at a temperature of 450° to 500° C. When the sample was further heated locally, bending occurred at a boundary between high and low temperature portions, so that it was found that there is a vitrification temperature on the low temperature side.

The dielectric constant of the thin ribbon having a thickness of 10 $\mu$m, a width of 0.5 mm and a length of 5 mm was measured just like as shown in FIG. 2. The dielectric constant was 80, which was larger than that of a conventional $LiNbO_3$ single crystal.

The motional impedance of the thin ribbon was further measured. It was confirmed that electric oscillation is converted into mechanical vibration, and it was found that the thin ribbon can be utilized as an electric-mechanical transformer.

EXAMPLE 4

$PbTiO_3$ including $B_2O_3$ as a glass former by 20 atomic percentages was fused at a temperature of 1,300° to 1,350° C. in the apparatus shown in FIG. 3 and a thin and flexible ribbon of dielectric material 38 was obtained in a natural atmosphere under an atmospheric pressure, the rotation speed of 3,000 rpm and the ejection pressure of 0.8 atmospheric pressure.

The obtained thin ribbon had a very good surface condition and was transparent. The ribbon had a thickness of 20 $\mu$m, a width of 0.5 to 1.5 mm and a uniform long length. When observed by X-rays and a metallurgical microscope, almost all thin ribbon was under the amorphous state.

Figure 5:
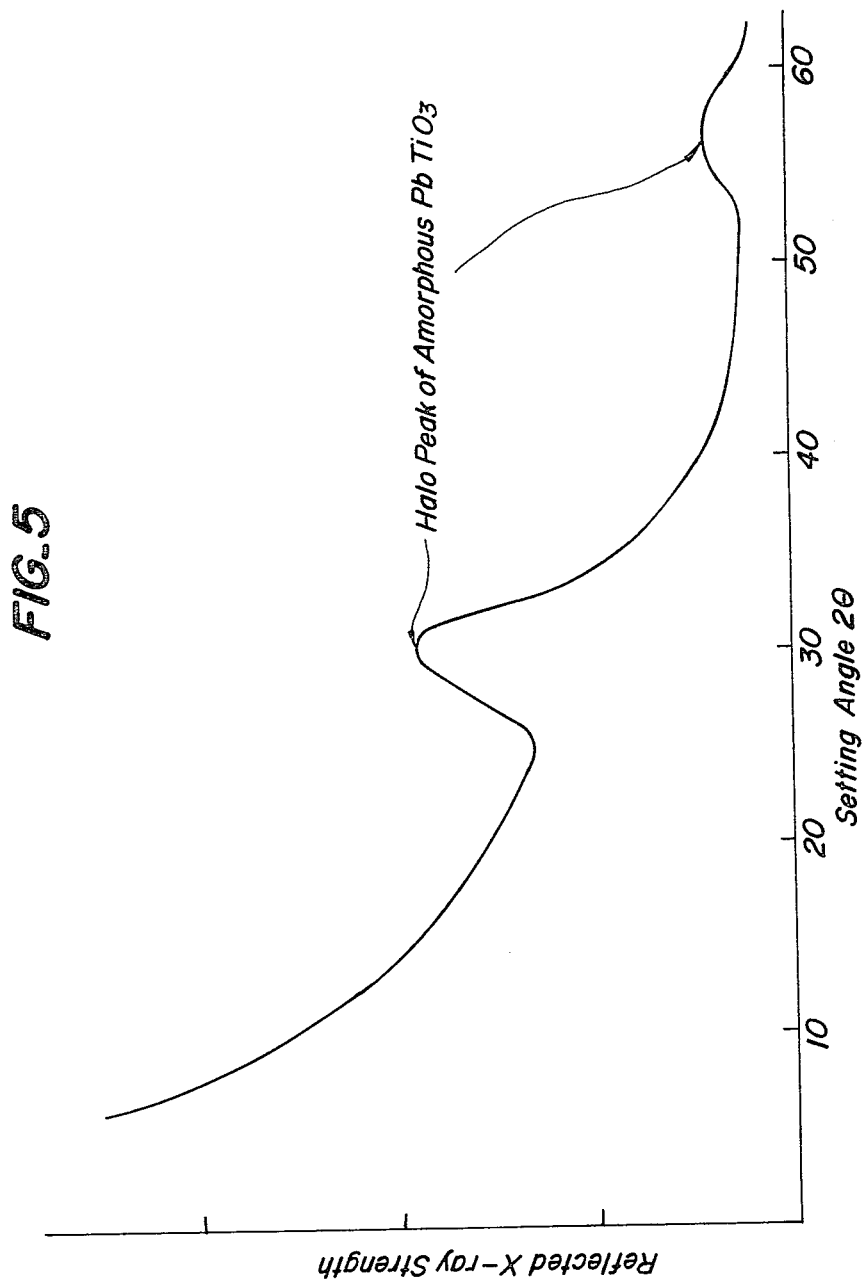
FIG. 5 is a graph of an X-ray diffraction of the thin dielectric ribbon.

For further confirmation, when a CuK$\alpha$ ray was measured by a scintillation counter through a LiF monochrometer, a halo curve particular to the amorphous was observed as shown in FIG. 5 and it was confirmed that the sample was amorphous.

In FIG. 5, an ordinate shows a counter value proportional to reflected X-ray strength and a abscissa shows a setting angle $2\theta$ of the counter. As apparent from FIG. 5, wide extremities are observed at about 30° and 57°.

Further, this sample was heated and observed by a high temperature metallurgical microscope under the cross nicol state, and as a result, it was confirmed that the sample was crystallized at a temperature of 400° to 500° C.

In the same manner as Example 3, its characteristics were measured, and as a result, the dielectric constant over several tens degrees on the side of a low temperature of the crystallization temperature was far larger than that at a room temperature. It was also found that the thin ribbon according to the invention can be utilized as an electric-mechanical transformer.

Besides the above, as oxides, fluorides, nitrates, phosphates, etc., or their mixture added to a thin ribbon of dielectric material as a glass former, the followings are mentioned.

$(BaTiO_3)_{0.45}(B_2O_3)_{0.55}$
$(PbZrO_3)_{0.95}(Bi_2O_3)_{0.05}$
$(NaNbO_3)_{0.8}(PbTiO_3)_{0.15}[Pb_3(P_3O_4)_2]_{0.05}$
$[Pb(Fe_{\frac{1}{2}}Nb_{\frac{1}{2}})O_3]_{0.5}[(B_2O_3)_{0.2}(PbO)_{0.8}]_{0.5}$
$(BaTiO_3)_{0.7}[(MnO)_{0.1}(K_2S_2O_7)_{0.9}]_{0.3}$
$(LiNbO_3)_{0.9}[(ZrO_2)_{0.2}Na(NO_3)_{0.8}]_{0.1}$
$(LiNbO_3)_{0.3}(FeTiO_3)_{0.4}[(K_2O)_{0.4}(Bi_2O_3)_{0.6}]_{0.3}$
$(PbNb_2O_5)_{0.6}(PbZrO_3)_{0.1}[(Ta_2O_3)_{0.2}(K_2S_2O_7)_{0.8}]_{0.3}$
$(KNbO_3)_{0.8}(CdTiO_3)_{0.1}[(ZnF_2)_{0.2}(B_2O_3)_{0.8}]_{0.1}$
$(KNbO_3)_{0.6}(NaNbO_3)_{0.2}[(SiO_2)_{0.2}(Na_2S_2O_7)_{0.8}]_{0.2}$
$(LiNbO_3)_{0.8}[(SiO_2)_{0.1}(Al_2O_3)_{0.1}(K_2S_2O_7)_{0.8}]_{0.2}$
$(NaNbO_3)_{0.7}[(MgF_2)_{0.1}(BaF_2)_{0.2}(PbF_2)_{0.7}]_{0.3}$
$(PbTiO_3)_{0.55}[(BiF_2)_{0.1}(LiF)_{0.3}(N_2S_2O_7)_{0.6}]_{0.45}$
$(LiNbO_3)_{0.8}[(NaF)_{0.15}(BiF_3)_{0.25}(PbO)_{0.6}]_{0.2}$
$(La-BiCr-Fe_2O_3)_{0.5}[(In_2O_3)_{0.1}(AgNO_3)_{0.1}(Na_2S_2O_7)_{0.8}]_{0.5}$
$(NaNbO_3)_{0.7}(NaSbO_3)_{0.1}[(MnO)_{0.2}(SnO_2)_{0.2}(PbO)_{0.6}]_{0.2}$
$(YMnO_3)_{0.1}(LiTaO_3)_{0.6}[(MnO)_{0.05}(Al_2O_3)_{0.1}(K_2SO_4)_{0.85}]_{0.3}$
$(PbTiO_3)_{0.6}[(Al_2O_3)_{0.05}(CaO)_{0.05}(WO_3)_{0.1}(SnO_2)_{0.8}]_{0.4}$
$(LiNbO_3)_{0.6}(NaNbO_3)_{0.1}[(MnO)_{0.05}(GeO_2)_{0.05}(P_2O_5)_{0.1}(B_2O_3)_{0.8}]_{0.3}$
$(PbTiO_3)_{0.9}[(MgO)_{0.02}(ZnO)_{0.08}(BaO)_{0.1}(In_2O_3)_{0.3}(PbF_2)_{0.5}]_{0.1}$

EXAMPLE 5

In this example six raw materials were prepared as shown in the following Table I. Each sample contained the glass former as shown in the table.

TABLE I

| Sample No. | Dielectric material | Glass former (atomic %) | $\epsilon r$(1KHz, 25° C.) | $\rho(\Omega \cdot cm)$ | B.D.V. (v/mm) |
|---|---|---|---|---|---|
| 1 | $BaTiO_3$ | $B_2O_3$(1%) + PbO(5%) | 40 | $>10^{13}$ | $>10^7$ |
| 2 | $PbTiO_3$ | $SnO_2$(3%) + $Sb_2O_3$(3%) | 35 | " | " |
| 3 | $SrTiO_3$ | $B_2O_3$(10%) | 20 | " | " |
| 4 | $Pb(Zr,Ti)O_3$ | $B_2O_3$(5%) + $SiO_2$(3%) | 40 | " | " |
| 5 | $Bi_4Ti_3O_{12}$ | $B_2O_3$(2%) + $SiO_2$(2%) | 65 | " | " |
| 6 | $LiNbO_3$ | $B_2O_3$(20%) | 20 | " | " |

In the tube 25 of the apparatus shown in FIG. 3 powders of the raw material of each sample having a weight 0.5 to 1.0 gr. were charged and fused at a temperature more than 1,300° C. The melt thus formed was ejected through the nozzle 25A under the ejection pressure of 1 atm. of Ar gas against the cooling surface of the disc 22 rotating at 2,000 rpm. Then a thin and flexible ribbons were obtained.

Dielectric constants $\epsilon r$ at 1 KHz and 25° C., specific resistivities $\rho(\Omega \cdot cm)$ and breakdown voltage B.D.V. (v/mm) were measured for these ribbons. The measuring results are illustrated in the table I. The ribbons had a typical dimension of 3 mm in width, 4 mm in length and 10 $\mu m$ in thickness. It was further confirmed that the ribbons include the amorphous texture by more than 99% in volume.

Next the amorphous ribbons thus obtained were subjected to the heating treatment under various temperatures and the dielectric constants and grain diameters were measured after heating. In this case the heating was effected for 60 minutes for each samples and the measurement was conducted at 25° C. The measuring results are shown in the following Table II.

It was found that the flexibility of the ribbon is still sufficiently high and the dielectric constant and breakdown voltage of the ribbon are very high. Such a ribbon of dielectric material is particularly suitable for manufacturing a laminated capacitor and other types of capacitors.

According to the invention the thin and flexible ribbon of dielectric material having the amorphous structure by more than 50% at an area ratio can be simply and speedily obtained by ejecting the melt of dielectric material through the nozzle against the moving surface of the cooling substrate and cooling rapidly the jet flow of the melt on the surface. The dielectric constant of the thus obtained ribbon is quite higher than that of a conventional amorphous dielectric substance. The dielectric constant can be increased by heating the ribbon so as to form larger crystalline grains of dielectric material. The mechanical strength such as flexibility, and impact strength is also superior to the known dielectric plate or chip. For example a chip-like capacitor can be obtained simply by cutting the ribbon into any optional size and by providing the electrodes thereto. The thin and flexible ribbon according to the invention is advantageously

TABLE II

| Sample No. | 150° C. | | 300° C. | | 700° C. | | 900° C. | | 1,100° C. | | 1,300°C. | |
|---|---|---|---|---|---|---|---|---|---|---|---|---|
| | $\epsilon r$ | Grain size | $\epsilon r$ | Grain size | $\epsilon r$ | Grain size | $\epsilon r$ | Grain size | $\epsilon r$ | Grain size | $\epsilon r$ | Grain size |
| 1 | 40 | <0.001 | 45 | 0.01 | 60 | 0.02 | 300 | 0.2 | 520 | 0.6 | 860 | 3.0 | cracks |
| 2 | 35 | <0.001 | 40 | 0.01 | 40 | 0.02 | 80 | 0.1 | 120 | 0.7 | 150 | 4.0 | " |
| 3 | 20 | <0.001 | 30 | 0.01 | 35 | 0.02 | 80 | 0.2 | 100 | 0.5 | 140 | 3.0 | " |
| 4 | 40 | <0.001 | 50 | 0.01 | 35 | 0.02 | 120 | 0.2 | 180 | 0.5 | 360 | 3.0 | " |
| 5 | 65 | <0.001 | 70 | 0.01 | 70 | 0.02 | 80 | 0.1 | 160 | 0.4 | 200 | 3.0 | " |
| 6 | 20 | <0.001 | 25 | 0.5 | 35 | 3.0 | cracks | | cracks | | cracks | | " |

As can be understood from the table II the dielectric constants and grain diameters become larger in dependence upon the increase of the heating temperature. However when the ribbons were heated at an excessively high temperature cracks were produced in the ribbons. Whereas when the heating temperature was two low, the increase in dielectric constant and grain diameter could not be substantially recognized. Therefore according to the invention it is required that the heating treatment is carried out at a temperature within the range of 300° C. to 1,100° C.

Figure 6:
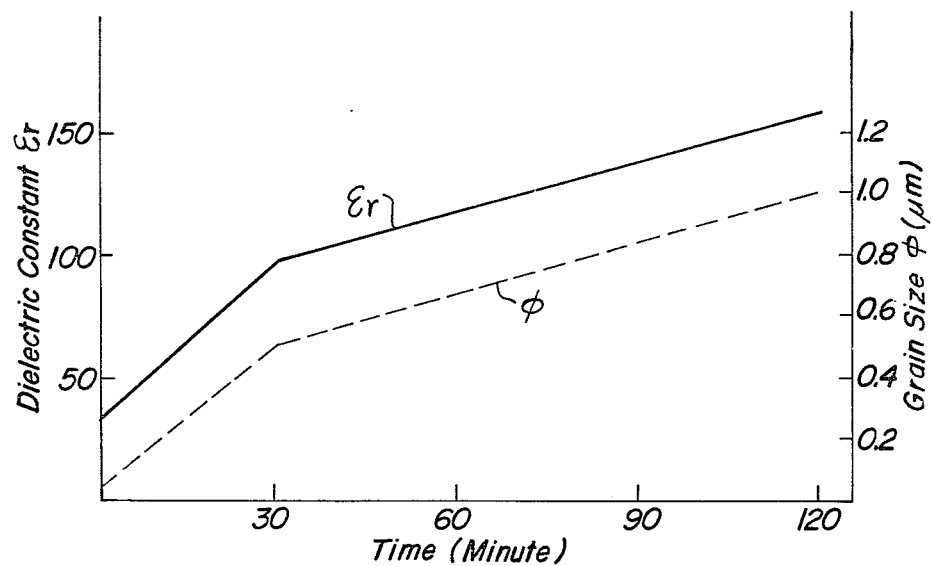
FIG. 6 is a graph showing variations in dielectric constant and grain diameter of the thin dielectric ribbon during a heating treatment.

Next the increase in dielectric constant $\epsilon r$ and grain size $\phi$ in dependence on the heating period was measured for the sample No. 2. The heating was conducted at 900° C. up to 120 minutes. The measuring result is illustrated in a graph of FIG. 6. It was confirmed that crystallization appears wholly in the ribbon and the grains become larger depending upon the heating period. It is recognized that the dielectric constant can be adjusted by suitably selecting the heating period.

According to the invention by heating the amorphous ribbon as grown at a temperature within 300° C. to 1,100° C. for a sufficient time period the large grains having crystalline structure can be formed in the ribbon.

used for manufacturing various devices and elements such as transducer, vibrator, filter, light conducting path, light modulator, piezoelectric element, photoelectric recorder, thermal recorder, photo detector, dielectric amplifier, oscillator, dielectric variable delay line, dielectric logic element, electrostatic relay, electrostatic transformer, etc.

What is claimed is:

1. A method for manufacturing a thin and flexible ribbon of dielectric material comprising the steps of
heating a raw material consisting essentially of a dielectric material which can form a crystalline structure in a solid state and up to 50 atomic percent of a glass former at a temperature from the melting point of the raw material to about 300° C. above the melting point to form a one phase melt of the raw material;
ejecting the melt through a nozzle under a pressure in the form of a jet flow against a moving surface of a cooling substrate moving at a speed of more than about 5 m/sec; and
cooling the jet flow of the melt on the cooling surface at a cooling rate of about 1,000° to 1,000,000° C./sec so as to form a thin and flexible ribbon of the dielectric material containing an amorphous texture in an amount of more than 50% by area ratio.

2. A method as defined in claim 1, wherein the raw material is heated at a temperature from the melting point to 150° C. above the melting point.

3. A method as defined in claim 1, wherein the dielectric material is selected from the group consisting of $BaTiO_3$, $PbTiO_3$, $Pb(Ti,Zr)O_3$, $LiTaO_3$, $NaNbO_3$, $NaTaO_3$, $AgNbO_3$, $Pb(Zn_{\frac{1}{3}}Nb_{\frac{2}{3}})O_3$, $Pb(Fe_{\frac{1}{2}}Nb_{\frac{1}{2}})O_3$, $Ba_2Nb_2O_7$, $Ca_2Nb_2O_7$, $Ba_2Ta_2O_7$, $BaBi_2Ta_2O_9$, $K_xWO_3(0.43 \leq x \leq 0.51)$, $PbNb_2O_6$ and composites thereof.

4. A method as defined in claim 1, wherein the glass former is selected from the group consisting of $B_2O_3$, PbO, $Bi_2O_3$, $Li_2O$, $K_2O$, MnO, $Lu_2O_3$, $Cs_2O$, SnO, $SnO_2$, $GeO_2$, $Sb_2O_3$, $P_2O_5$, $V_2O_5$, $In_2O_3$, BeO, MgO, CaO, ZnO, CdO, SrO, BaO, $ThO_2$, $ZrO_2$, $WO_3$, $SiO_2$, $Al_2O_3$, $As_2O_3$, $PbF_2$, LiF, NaF, $BeF_2$, $MgF_2$, $ZnF_2$, $CdF_2$, $SrF_2$, $BaF_2$, $AlF_3$, $BiF_3$, $CeF_3$, $SnF_4$ and composites thereof.

5. A method as defined in claim 1, wherein the ejection of the melt against the cooling surface is effected in a reduced pressure or a vacuum.

6. A method as defined in claim 1, wherein the ejection of the melt against the cooling surface is conducted in a reduced inert gas atmosphere.

7. A method as defined in claim 1, wherein the ejection of the melt is carried out through the nozzle made of material selected from the group consisting of platinum and platinum-rhodium.

8. A method as defined in claim 7, wherein the nozzle is lined with boron nitride.

9. A method as defined in claim 1, wherein the ejection pressure is within the range of from about 0.01 to 1.5 atm.

10. A method as defined in claim 9, wherein the ejection pressure is within the range of from about 0.01 to 1.0 atm.

11. A method as defined in claim 1, wherein the moving surface of the cooling substrate is made of material selected from the group consisting of copper, copper-beryllium, brass, stainless steel and carbon steel.

12. A method as defined in claim 1, wherein the cooling substrate comprises a rotating disc which has a smooth peripheral edge.

13. A method as defined in claim 1, wherein the cooling substrate comprises a rotating drum which has a smooth inner surface.

14. A method as defined in claim 1, wherein the cooling substrate comprises an endless belt having a smooth surface.

15. A method as defined in claim 1, wherein the nozzle has a circular, elliptical or rectangular hole.

16. A method as defined in claim 1 further comprising the step of heating the thin and flexible ribbon as grown at a temperature within the range from 300° C. to 1,100° C. for such a time period that grains of crystalline texture of the dielectric material having sizes of 0.01–5.0 μm are grown in the ribbon.

17. A method as defined in claim 16, wherein the heating of the thin and flexible ribbon is effected in a vacuum or reduced atmosphere.

18. A method as defined in claim 16, wherein the heating of the thin and flexible ribbon is carried out in an inert gas atmosphere.

* * * * *